United States Patent [19]

Ide et al.

[11] Patent Number: 4,903,093
[45] Date of Patent: Feb. 20, 1990

[54] SEMICONDUCTOR INTEGRATED CIRCUIT DEVICE DOUBLE ISOLATED CMOS INPUT PROTECTION RESISTOR

[75] Inventors: Akira Ide; Koichi Motohashi, both of Takasaki; Masanori Odaka, Kodaira; Nobuo Tamba, Ohme, all of Japan

[73] Assignee: Hitachi, Ltd., Tokyo, Japan

[21] Appl. No.: 199,671

[22] Filed: May 27, 1988

[30] Foreign Application Priority Data

Jun. 5, 1987 [JP] Japan ................................ 62-142027

[51] Int. Cl.[4] ............................................. H01L 27/04
[52] U.S. Cl. .................................... 357/23.13; 357/42; 357/43; 357/51
[58] Field of Search .................. 357/23.13, 41, 42, 48, 357/51, 43

[56] References Cited

U.S. PATENT DOCUMENTS

| | | | |
|---|---|---|---|
| 3,712,995 | 1/1973 | Steudel | 357/23.13 |
| 4,044,373 | 8/1977 | Nomiya et al. | 357/23.13 |
| 4,554,729 | 11/1985 | Tanimura et al. | 357/23.13 |

FOREIGN PATENT DOCUMENTS 58-14562 1/1983 Japan ................................ 357/23.13
62-224057 10/1987 Japan .

OTHER PUBLICATIONS

Watanabe et al., IEEE International Electron Device Meeting, Technical Digest, Dec. 1, 1985, pp. 423-426.

Primary Examiner—William D. Larkins
Attorney, Agent, or Firm—Antonelli, Terry & Wands

[57] ABSTRACT

In a semiconductor integrated circuit device, input protective elements have current limiting resistors which are diffused resistors of a second conductivity type formed in a first semiconductor region of a first conductivity type isolated electrically by a second semiconductor region of the second conductivity type, with the first conductivity type semiconductor region being in a floating state electrically. The input protective elements create less leak current and have high electrostatic durability.

11 Claims, 5 Drawing Sheets

SEMICONDUCTOR INTEGRATED CIRCUIT DEVICE DOUBLE ISOLATED CMOS INPUT PROTECTION RESISTOR

BACKGROUND OF THE INVENTION

The present invention relates to a semiconductor integrated circuit device and, particularly, to the technique applicable effectively to the input protective element of semiconductor integrated circuit devices (bipolar-CMOS LSIs) incorporating bipolar transistors and MISFETs.

Lately, research and development has been rather active in bipolar-CMOS LSIs in which bipolar transistors and complementary MISFETs are formed on the same substrate, as described in publication IEDM 1985, Technical Digest, pp. 423-426, for example.

Japanese Patent Application No. 61-65730, which was filed by the applicant of the present invention, deals with an input protective element for bipolar-CMOS LSIs. In this protective element, n-channel MISFETs, with their source and gate electrodes being connected to the ground voltage, are used for voltage clamping. The n-channel MISFETs are formed in a p-well which is provided on a p-type silicon substrate through a p+ type isolation diffused region (P-iso). The input protective element is designed for the following. If an abnormal positive voltage (e.g., 15 volts) higher than the drain-source breakdown voltage $BV_{DS}$ is applied to an input terminal, the current is led to the ground mainly on the basis of the drain-source punch-through phenomenon. If an abnormal negative voltage in excess of the forward build-up voltage $V_F$ of a parasitic diode made up of the drain region of n-channel MISFET and the p-well is applied to an input terminal, the current is led through the parasitic diode to the input terminal so as to prevent the abnormal voltage application to the internal gate circuit (input buffer). The n-channel MISFET and parasitic diode in unison serve to protect the internal gate circuit from electrostatic destruction. With the intention of limiting the substrate current when a negative voltage attributable to the undershooting of input signal is applied, the input protective element is provided with a polycrystalline silicon resistor between the drain of the n-channel MISFET and the input pad.

SUMMARY OF THE INVENTION

As circuit integration density becomes further advanced, an input protective element, such as the above-mentioned voltage clamping n-channel MISFET, is also required to be much smaller. Consequently, the input protective element itself could be broken by an abnormal input voltage, resulting in a lowered electrostatic durability. The current limiting polycrystalline silicon resistor is surrounded by an insulation layer, which hampers the conductive cooling against the heat produced by the current, resulting frequently in the breakage of wiring at the contact. A conceivable manner for improving the above heat conduction is the use of a p-type or n-type diffused resistor, which is formed by introduction of a p-type or n-type impurity to the surface of the semiconductor substrate, in place of the polycrystalline silicon resistor. In this case, however, the inventors of the present invention have revealed the following problems.

Figure 14:
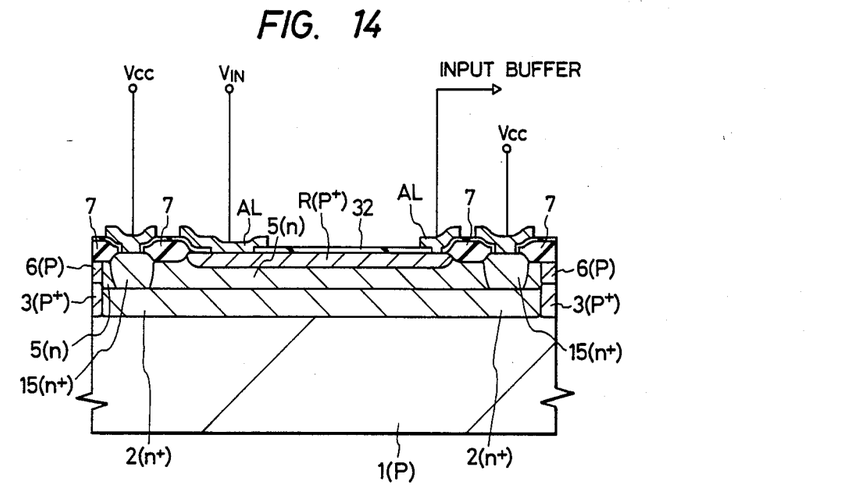
FIG. 14 is a principal cross-sectional view of the input section of the static RAM formed of bipolar CMOS, which the inventors of the present invention had examined before the present invention was completed.

1. Problems in using a p+ type diffused resistor as a current limiting resistor:

FIG. 14 shows the cross-section of part of the input section of the static RAM based on bipolar CMOS LSI, which the inventors have examined. In a semiconductor substrate 1, e.g., p-type silicon substrate, an input protective $p^{30}$ type diffused resistor R (p+) is formed in an n-well (epitaxial layer) 5 formed through an n+ type buried layer 2. The n-well 5 is supplied with a power voltage $V_{CC}$ (5 volts) by an n+ type semiconductor region 15 which is formed in the same processing step as an n+ type collector lead-out diffused layer for a bipolar transistor, so that a pn junction made up of the n-well 5 and the p+ type diffused resistor is reversely biased. A p+ type isolation diffused region 3 and a p-well (epitaxial layer) 6 formed on it is the region where the voltage clamping n-channel MISFETs are formed. A field insulation layer 7 and insulation layer 32 are made of $SiO_2$ film.

When the input protective diffused resistor R (p+) of the foregoing structure has an application of a positive input voltage Vin higher than $V_{CC}$, for example, through an aluminum electrode AL, the pn junction is forward-biased and a leak current flows into the n-well 5 and n+ type buried layer 2, causing the supplied voltage $V_{CC}$ to vary. The power voltage $V_{CC}$ is used commonly for the peripheral circuit and memory cells, and therefore malfunctioning of the semiconductor device could result. The above-mentioned leak current can undesirably activate a parasitic pnp bipolar transistor made up of the diffused resistor R (p+), n+ type buried layer 2 and p-type semiconductor substrate 1, causing a large current to flow in the p-type semiconductor substrate 1, resulting in a significant voltage drop across the substrate.

Figure 15:
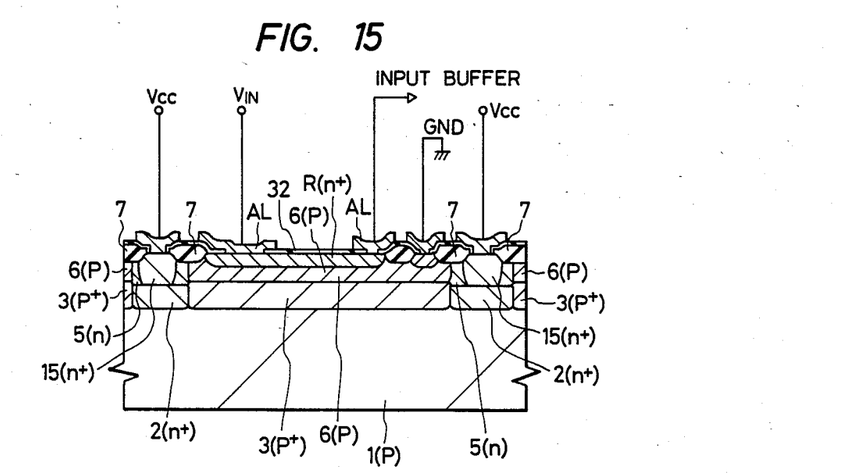
FIG. 15 is a principal cross-sectional view of the input section of the static RAM formed of bipolar CMOS, which the inventors of the present invention had examined before the present invention was completed.

2. Problems in using an n+ type diffused resistor as a current limiting resistor:

FIG. 15 shows the cross-section of part of the input section of the static RAM based on bipolar-CMOS LSI, which the inventors have examined. In a p-type semiconductor substrate 1, as in the preceding case, an input protective n+ type diffused resistor R(n+) is formed in a p-well 6 formed through a p+ type isolation diffused region 3. The p-well 6 is supplied with a ground voltage GND (0 volt) by a p+ type semiconductor region 6A, so that a pn junction made up of the p-well 6 and the n+ type diffused resistor R(n+) is reversely biased.

When the input protective diffused resistor R(n+) of the foregoing structure has an application of a negative input voltage Vin in excess of GND (0 volt), the pn junction is forward-biased and minority carriers are injected from the n+ type diffused resistor R(n+) through the p-well 6 and p+ type isolation diffused region 3. The minority carriers can reach the memory cell region, resulting in the loss of stored information. A large leak current flows in the p-well 6, causing the ground voltage GND to vary, and therefore malfunctioning of the semiconductor device could result.

The present invention is intended to solve the foregoing problems.

Accordingly, it is an object of the present invention to provide a technique useful for improving the reliability of semiconductor integrated circuit devices.

Another object of this invention is to provide a technique useful for enhancing the electrostatic durability of semiconductor integrated circuit devices.

Still another object of this invention is to provide a technique useful for preventing the breakage of the current limiting resistor of the input protective element in devices.

These and other objects and novel features of this invention will become more apparent from the following detailed description taken in conjunction with the accompanying drawings.

Before entering into the details, the present invention will be summarized in the following.

The input protective element has a current limiting resistor, i.e., a diffused,, resistor of a second conductivity type, formed in a first semiconductor region of a first conductivity type which is isolated electrically from the semiconductor substrate by a second semiconductor region of the of the second conductivity type, with said first semiconductor region of first conductivity type being placed in a floating state electrically. Since the first semiconductor region of first conductivity type is in a floating state electrically, even in the case where a pn junction which is formed by the diffused resistor of the second conductivity type and the first semiconductor region of the first conductivity type is forwardly biased by an abnormal voltage input, no base current is supplied to a parasitic bipolar transistor formed of the diffused resistor of the second conductivity type, the first semiconductor region of the first conductivity type and the second semiconductor region of the second conductivity type thereby resulting in the transistor remaining inactive, since a leak current is prevented from flowing. Consequently, the supplied voltage $V_{CC}$, the ground voltage GND $V_{SS}$ and the voltage across the substrate, which would otherwise fluctuate in the presence of such a leak current, can be stabilized, and the reliability of the semiconductor integrated circuit device is improved. The diffused resistor can be formed directly in the semiconductor body having a high thermal conductivity, and the heat produced by the current in the resistor can be removed more effectively than the case of a resistor of input protective element formed of a polycrystalline silicon film. Consequently, the current limiting resistor is prevented from heat-breakage, and the device can have enhanced electrostatic durability.

DESCRIPTION OF THE PREFERRED EMBODIMENTS

A specific embodiment of the present invention will now be described with reference to the drawings. In all figures, portions having identical functions are given the same symbols, and their explanation will not be repeated.

Figure 1:
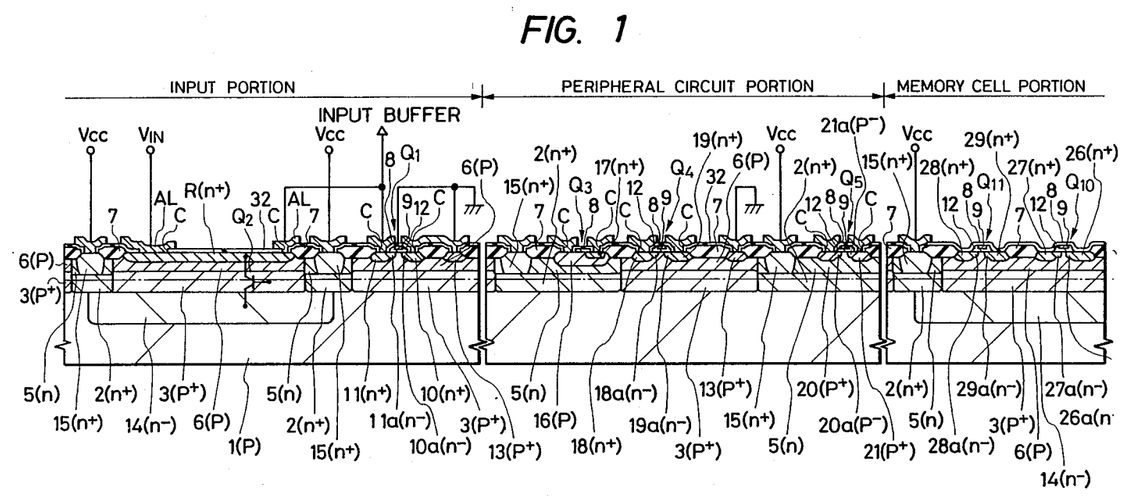
FIG. 1 is a cross-sectional view of the bipolar CMOS LSI embodying the present invention.

FIG. 1 shows, as an example, the cross-section of the inventive bipolar CMOS LSI which is applied to a static RAM (Random Access Memory) device. The static RAM based on the bipolar CMOS LSI of this embodiment of invention includes an input section, peripheral circuit section and memory cell section, as shown in the figure.

The bipolar CMOS LSI is provided, in a semiconductor substrate 1, e.g., p-type silicon substrate, with numerous buried layer 2 of n+ type, for example, and isolation diffused region 3 of p+ type, for example. Formed on the semiconductor substrate 1 is an epitaxial layer, e.g., silicon layer 4. Before growing the epitaxial layer 4, the semiconductor substrate 1 has the surface as shown by the dash-dot line. In the epitaxial layer 4, an n-well 5 and p-well 6 are formed in correspondence to the buried layers 2 and 3, respectively. Field insulation films 7, e.g., $SiO_2$ film, are formed selectively on the surface of the epitaxial layer 4 for the isolation between elements. An insulation film 8, e.g., $SiO_2$ film, is formed on the surface of the n-well 5 and p-well 6 in portions surrounded by the field insulation film 7.

Figures 2, 3, 4:
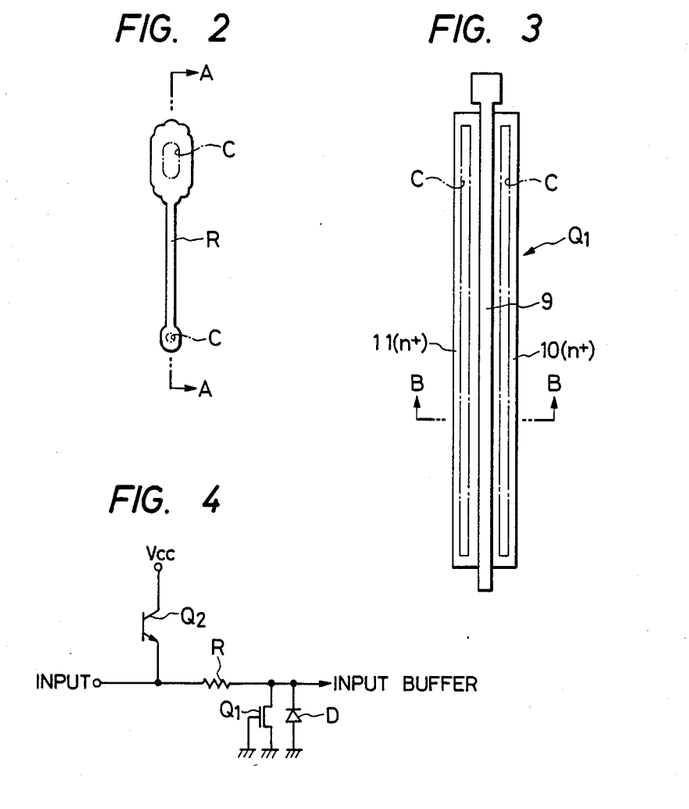
FIG. 2 is a plan view of the current limiting resistor of the input protective element in the bipolar CMOS LSI shown in FIG. 1.
FIG. 3 is a plan view of the n-channel MOS FET in the input protective element in the bipolar CMOS LSI shown in FIG. 1.
FIG. 4 is a schematic diagram showing the equivalent circuit of the input protective element in the bipolar CMOS LSI shown in FIG. 1.

In the input section, an n+ type diffused resistor R in the form of an n+ type semiconductor region, for example, is formed in the p-well 6 which is in a floating state electrically, and the diffused resistor R constitutes a current limiting resistor of the input protective element which will be described later. The diffused resistor is formed directly in the semiconductor body having high thermal conductivity, and the heat produced by the current in the resistor can be led out promptly toward the semiconductor substrate 1. Consequently, an aluminum wire AL to the diffused resistor R is prevented from heat-breakage at the contact section (contact holes are indicated by symbol C). The diffused resistor R has a resistance of 200–600 Ω, for example. FIG. 2 is a plan view of the diffused resistor R. The cross-section of FIG. 1 is taken along the line A-A of FIG. 2.

Indicated by symbol 9 is a gate electrode made of a polycide film provided with a high fusion metallic silicide film, e.g., tungsten silicide ($WSi_2$) film, on the polycrystalline silicon layer, for example. The gate electrode 9 can also be formed of a sole polycrystalline film for example. Provided in the p-well 6 of the input section are a source region 10 and drain region 11 of n+ type, for example, in a self-matching fashion to the gate electrode 9 and a side wall 12 which will be explained later. The gate electrode 9, source region 10 and drain region 11 in combination constitute an n-channel MOS FET (MISFET) Q1.

The gate electrode 9 is provided on its side with a side wall 12 made of insulation material, e.g., $SiO_2$. The source region 10 and drain region 11 are provided in their lower extending portions with low impurity concentration sections 10a and 11a of n+ type, for example. Namely, the n-channel MOS FET Q1 has a so-called LDD (Lightly Dropped Drain) structure in which the portion of drain region 11 has its electric field dulled by the low impurity concentration section 11a. The gate electrode 9 and source electrode are grounded. In the p-well 6 where the n-channel MOS FET Q1 is formed, there is further provided a semiconductor region 13 of p+ type, for example, in the periphery of the Q1. The semiconductor region 13 is grounded (e.g., to 0 volt), and the p-well 6 is also grounded accordingly. FIG. 3 shows a plan view of the n-channel MOS FET Q1. The cross-sectional view of FIG. 1 is taken along the line B-B of FIG. 3.

In this embodiment, the semiconductor substrate 1 has a region 14 of n+ type, for example, beneath the diffused resistor R. Therefore, the p-well 6 and isolation diffused region 3 in which the diffused resistor R is formed is completely isolated from the semiconductor substrate 1 by the semiconductor region 14, buried layer 2 and n-well 5. This prevents minority carriers generated by the undershooting of input signal from being injected from the diffused resistor R into the semiconductor substrate 1. Consequently, the occurrence of latch-up or software error attributable to the undershooting of input signal can be prevented. The diffused resistor R, p-well 6, isolation diffused region 3 and semiconductor region 14 in combination form a parasitic bipolar transistor Q2. The parasitic bipolar transistor Q2 has its base region, which is formed of the p-well 6 and isolation region 3, being in a floating state as mentioned previously, and therefore the base of the transistor Q2 is normally in an open state. On this account, when a negative input voltage below the ground voltage (0 volt) is applied to an input terminal, by which the pn junction formed of the diffused resistor R and p-well 6 is forward-biased, the parasitic bipolar transistor Q2 supplied with no base current is maintained in the cutoff condition. As a result, the leak current from the diffused resistor R to the semiconductor region can be blocked, and the fluctuation of the supplied voltage $V_{CC}$ is prevented.

The semiconductor region 14, which forms the collector of the parasitic bipolar transistor Q2, is connected to the power voltage $V_{CC}$ through the buried layer 2 and a semiconductor region 15 of n+ type, for example, formed in the n-well 5. Instead of being connected to the power voltage $V_{CC}$, the semiconductor region 14 may be connected to a certain bias voltage above the ground voltage and below the power voltage.

In this embodiment, the diffused resistor R, the n-channel MOS FET Q1, a parasitic diode D formed of the drain region 11 and p-well 6, and the parasitic bipolar transistor Q2 in combination constitute an input protective element. The input protective element operates in such a way that, when an abnormal positive voltage in excess of the drain-source breakdown voltage $BV_{DS}$ of the n-channel MISFET is applied to the input terminal, the input current is led to the ground through the drain and source, or when an abnormal negative voltage in excess of the forward build-up voltage $V_F$ of the parasitic diode is applied to the input terminal, the input current is led toward the input terminal through the parasitic diode, thereby preventing the application of such abnormal voltages to the internal gate circuit (input buffer), and consequently electrostatic breakage of the device can be prevented. According to this embodiment, the parasitic bipolar transistor Q2 having an open base also functions as a voltage clamp occasionally. Namely, when an abnormal positive voltage above the open-base collector-emitter breakdown voltage $BV_{CEO}$ is applied to the input terminal, the input current is led toward the voltage source $V_{CC}$ through the collector-emitter junction. Although the supplied voltage $V_{CC}$ will fluctuate, the application of the abnormal voltage to the internal gate circuit is prevented, and consequently device has enhanced electrostatic durability.

Figure 5:
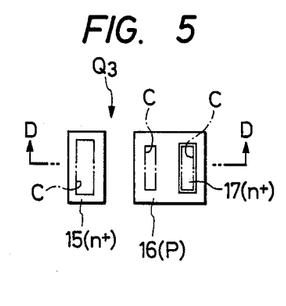
FIG. 5 is a plan view of the npn bipolar transistor used in the peripheral circuit section of the bipolar CMOS LSI shown in FIG. 1.

Next, in the peripheral circuit section, the n-well 5 is provided therein with a base region 16 of p-type, for example, in which an emitter region 17 of n+ type, for example, is formed. The base region 16 and emitter region 17 and the n-well 5 and buried layer 2 in combination constitutes an npn bipolar transistor Q3. FIG. 5 shows the plan view of the npn bipolar transistor Q3. The cross-sectional view of FIG. 1 is taken along the line D—D of FIG. 5.

Figure 6:
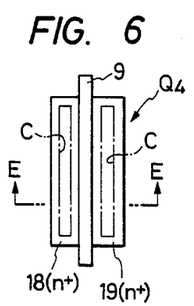
FIG. 6 is a plan view of the n-channel MOS FET used in the peripheral circuit section of the bipolar CMOS LSI shown in FIG. 1.

Formed in the n-well 6 is a source region 18 and drain region of n+ type, for example, in a self-matching fashion with the gate electrode 9 and side wall 9 formed over the insulation layer 8. The gate electrode 9, source region 18 and drain region 19 in combination constitute an n-channel MOS FET (MISFET) Q4. The source region 18 and drain region 19 are provided in portion beneath the side wall 12 with low impurity concentration sections 18a and 19a of n+ type for example. Namely, the n-channel MOS FET Q4 has an LDD structure in which the portion of drain region 19 has its electric field dumped by the low impurity concentration section 19a, as in the case of the n-channel MOS FET Q1. FIG. 6 shows a plan view of the n-channel MOS FET Q4. The cross-section of FIG. 1 is taken along the line E—E of FIG. 6.

Figure 7:
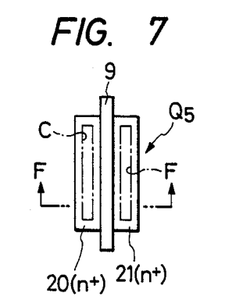
FIG. 7 is a plan view of the p-channel MOS FET used in the peripheral circuit section of the bipolar CMOS LSI shown in FIG. 1.
Figure 8:
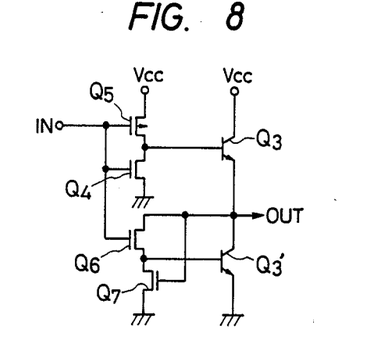
FIG. 8 is a schematic diagram showing the equivalent circuit of the inverter circuit which constitutes the peripheral circuit of the bipolar CMOS LSI shown in FIG. 1.

In the n-well 5 adjacent to the p-well 6 where the n-channel MOS FET Q4 is formed, there is provided a source region 20 and drain region 21 of p+ type, for example, in a self-matching fashion. The gate electrode 9, source region 20 and drain region 21 in unison constitute a p-channel MOS FET (MISFET) Q5. The source region 20 and drain region 21 is provided, in portions beneath the side wall 12, with low impurity concentration sections 20a and 21a of p− type, for example. Namely, the p-channel MOS FET Q5 also has an LDD structure in which the portion of the drain region 21 has its electric field dumped by the low impurity concentration section 21a. FIG. 7 is a plan view of the p-channel MOS FET Q5. The cross-section of FIG. 1 is taken along the line F—F of FIG. 7. The p-channel MOS FET Q5 and the previous n-channel MOS FET Q4 in combination constitute a CMOS (Complementary MOS FET). FIG. 8 shows, as an example, the inverter circuit made up of the CMOS, two npn bipolar transistors Q3 and Q3′, and n-channel MOS FETs Q6 and Q7 (not shown in FIG. 1). These bipolar-CMOS hybrid TTLs and CMOS logic circuits are combined to form the peripheral circuit section.

Figure 9:
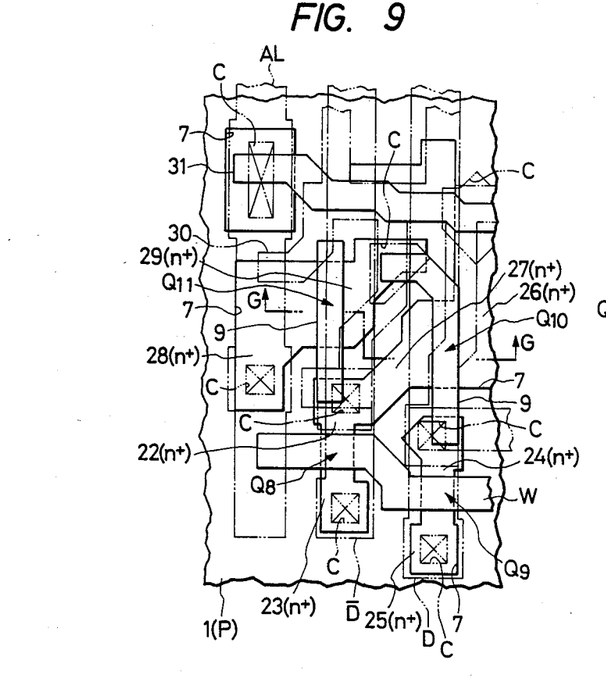
FIG. 9 is an enlarged plan view showing the principal portion of the memory cell section in the bipolar CMOS LSI shown in FIG. 1.
Figure 10:
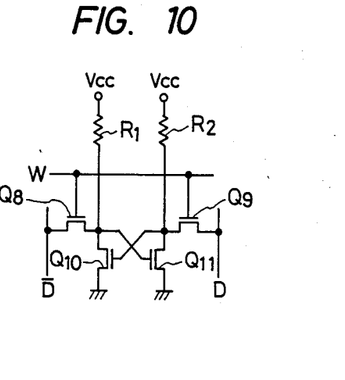
FIG. 10 is a schematic diagram showing the equivalent circuit of the memory cell in the bipolar CMOS LSI shown in FIG. 1.

FIG. 9 is an enlarged plan view showing the principal portion of the memory section. The cross-section of FIG. 1 is taken along the line G—G of FIG. 9. Each memory cell in a flip-flop configuration consists of high-resistivity polycrystalline silicon resistors R1 and R2 and n-channel MOS FETs Q8–Q11, as shown in FIG. 10. The circuit of FIG. 10 includes a word line W and data lines $\overline{D}$ and D.

As shown in FIG. 9, the n-channel MOS FET Q8 consists of a word line W made of polycide film, as for the gate electrode 9, and a source region 22 and drain region 23 of n+ type, for example, formed in the p-well 6 in a self-matching fashion to the word line W. Similarly, the n-channel MOS FET Q9 consists of a word line W and a source region 24 and drain region 25 of n+ type, for example, formed in the p-well 6 in a self-matching fashion to the word line W. The n-channel MOS FET Q10 consists of the gate 9 and a source region 26 and drain region 27 of n+ type, for example, formed in the p-well 6 in a self-matching fashion to the gate electrode 9 and side wall 12. Similarly, the n-channel MOS FET Q11 consists of the gate electrode 9 and a source region 28 and drain region 29 of n+ type, for example, formed in the p-well 6 in a self-matching fashion to the gate electrode 9 and side wall 12. As shown in FIG. 1, these source regions 26 and 28 and drain regions 27 and 29 have low impurity concentration sections 26a, 28a, 27a and 29a, and the n-channel MOS FETs Q10 and Q11 have a LDD structure in which the portions of drain regions 27 and 29 have their electric fields dulled by the low impurity concentration sections 27a and 29a. The n-channel MOS FETs Q8 and Q9 also have the LDD structure, although it is not shown in FIG. 1.

The semiconductor substrate 1 beneath the memory cell section is also provided with the semiconductor region 14, as shown in FIG. 1, so that the memory cell section is surrounded by the semiconductor region 14, buried layer 2 and n-well 5. On this account, if minority carriers are injected into the semiconductor substrate 1 by some reason and moved toward the memory cell section, they cannot reach memory cells and the memory is prevented from data destruction.

The high-resistivity polycrystalline silicon resistors R1 and R2 (not shown in FIG. 1) are made of the second polycrystalline silicon layer integrally with a power supply line 30 for $V_{CC}$. Indicated by symbol 31 in FIG. 9 is a ground line made of polycide film, for example, and it is connected to a power ground line through a contact hole C. Indicated by symbol 32 in FIG. 1 is an insulation film for passivation.

The static RAM based on the bipolar CMOS LSI of this embodiment is given a maximum high-level (H) input rating of about 6 volts (higher than $V_{CC}$), and it can have input/output ratings compatible with MOS static RAMs which have a minimum low-level (L) input rating of about −3 volts.

Next, an example of the method of fabricating the foregoing bipolar CMOS LSI will be described.

Figure 11:
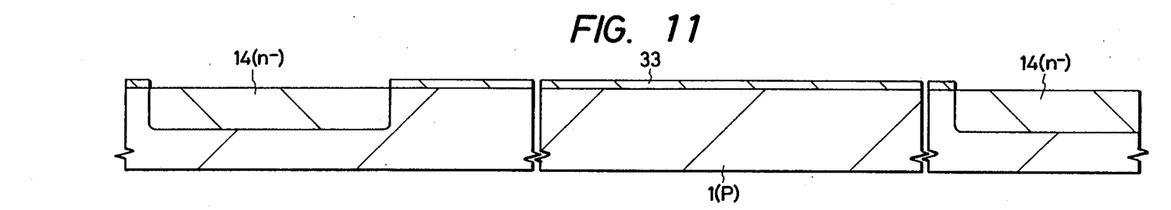
FIGS. 11, 12 and 13 are cross-sectional views of the bipolar CMOS LSI of FIG. 1 used to explain each step of fabricating process.

In FIG. 11, an insulation film 33, e.g., SiO$_2$ film, is formed on the surface of a semiconductor substrate 1. After the insulation film 33 has been turned into a specific pattern by etching, the substrate 1 is subjected to ion implantation of n+ type impurity, e.g., phosphorus, at a dose of $10^{13}/cm^2$ using the insulation film 33 as a mask, so that a semiconductor region 14 is formed. Then, the insulation film 33 is etched off.

Figure 12:
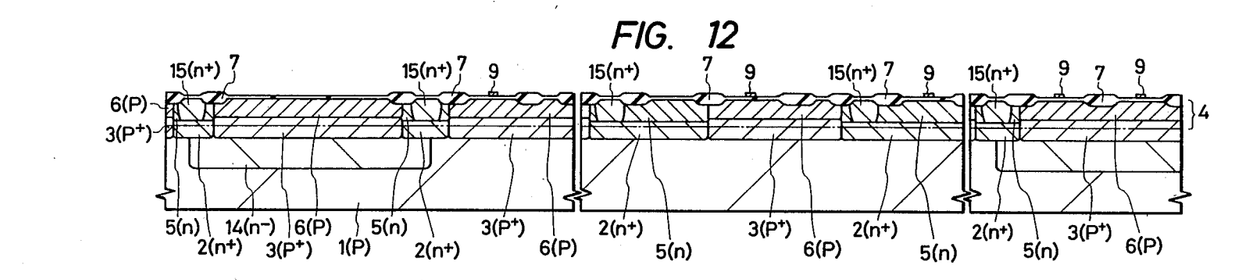

In FIG. 12, an n+ type buried layer 2 and p+ type isolation diffused region 3 are formed by ion implantation or the like in the semiconductor substrate 1, and subsequently an epitaxial layer 4 is formed by epitaxial growth, for example, on the semiconductor substrate 1. Next, n-type impurity and p-type impurity are ion-implanted into the epitaxial later 4 selectively so that an n-well 5 and p-well 6 are formed. Next, a field insulation film 7 is formed on the surface of the epitaxial layer 4 by selective oxidation for example. Next, an insulation film 8 is formed on the surface of the n-well 5 and p-well 6 surrounded by the field insulation film 7 by thermal oxidation for example. Next, a polycrystalline silicon film is formed over the entire surface by CVD (Chemical Vapor Deposition). After the polycrystalline silicon film has been turned to have low resistivity by doping n-type impurity, e.g., phosphorus, in such a manner as diffusion, a high fusion-point metallic silicide film is formed over the entire surface by CVD for example. Next, the high fusion-point metallic silicide film and the polycrystalline silicon film are patterned sequentially by anisotropic etching, e.g., reactive ion etching (RIE), so that a gate electrode 9 is formed. In this processing step, the word line W shown in FIG. 9 is formed at the same time. Next, a semiconductor region 15 used for the leads of the collector of bipolar transistors and power supply $V_{CC}$ are formed by ion-implanting n-type impurity, e.g., phosphorus, selectively into the n-well 5.

Figure 13:
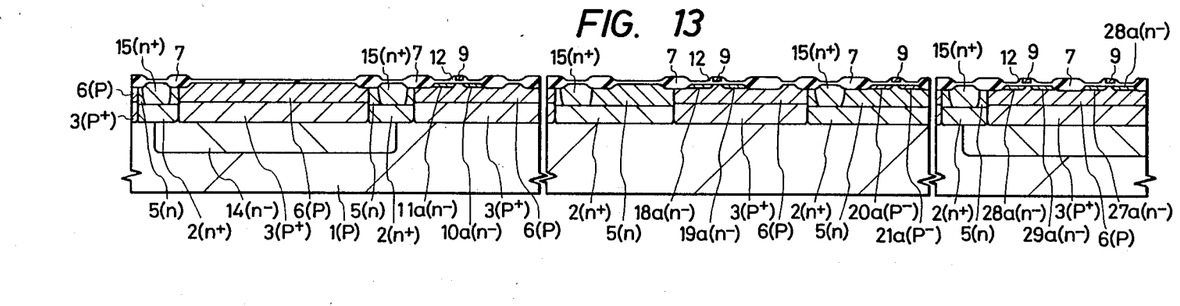

Subsequently, in FIG. 13, low impurity concentration sections 10a, 11a, 18a, 19a, 26a, 27a, 28a, 29a, and so on are formed by selective ion implantation of n-type impurity, e.g., phosphorus, at a dose of $10^{13}/cm^2$ into the p-well 6 using the gate electrode 9 and word line W as masks. Next, low impurity concentration sections 20a and 21a are formed by selective ion implantation of p-type impurity e.g., boron, at a dose $10^{13}/cm^2$, for example, into the n-well 5 using the gate electrode 9 as a mask. Next, after an insulation film, e.g., SiO$_2$ film, is formed over the entire surface by CVD, for example, a side wall 12 is formed on the side face of the gate electrode 9 and word line W through anisotropic etching for the insulation film in the substrate planar direction and vertical direction by RIE for example.

Subsequently, as shown in FIG. 1, a base region 16 is formed by selective ion implantation of p-type impurity, e.g., boron, into the n-well 5. Next, source regions 10, 18, 26 and 28 and drain regions 11, 19, 27 and 29 are formed in a self-matching fashion to the side wall 12 by selective ion implantation of n-type impurity e.g., arsenic, at a dose of $10^{16}/cm^2$, for example, into the p-well 6 using the side wall 12 as a mask. The diffused resistor R may also be formed in this ion implantation process. Alternatively, the diffused resistor R may be formed separately from the process of the drain-source region in order to make the intended resistance.

Next, a source region 20 and drain region 21 are formed in a self-matching fashion to the side wall 12 by selective ion implantation of p-type impurity, e.g., boron, at a dose of $10^{15}/cm^2$ into the n-well 5 using the side wall 12 as a mask. In this ion implantation process, the semiconductor region 13 may also be formed at the same time. Next, an emitter region 17 is formed by ion implantation of n-type impurity, e.g., arsenic.

Subsequently, after an insulation film, e.g., SiO$_2$ film, (not shown) has been formed over the entire surface, a polycrystalline silicon film is formed on it. Next, the surface of the polycrystalline silicon film of in regions including portions which will become the resistors R1 and R2 are masked with an insulation film, e.g., SiO₂ film, and ion implantation of n-type impurity, e.g., arsenic, is conducted into the polycrystalline silicon film, so that it turns to have low resistivity. Next, after the mask has been etched off, the polycrystalline silicon film is patterned by etching, and a polycrystalline silicon wire 30 and the resistors R1 and R2 are formed. After an insulation film 32 for passivation has been formed over the entire surface, contact holes C are formed Finally, an aluminum film, for example, is formed over the entire surface and it is patterned by etching to form the wire AL and data lines D and $\overline{D}$, and the bipolar CMOS LSI is completed.

Although the present invention has been described for a specific embodiment, the invention is not confined to the foregoing embodiment, but various modifications are possible without departing from the invention in its broader aspect.

For example, the diffused resistor R may have a different shape in plan view than that shown in FIG. 2. The MOS FETs Q1 and Q4–Q11 may not have the LDD structure, but, for example, the MOS FET Q1 may be made in a single drain structure without having the n⁻ type layers 10a and 11a, allowing it to have a lower breakdown voltage, with the remaining MISFETs Q4–Q11 being formed in the LDD structure of higher breakdown voltage.

Furthermore, it is of course possible to replace the npn bipolar transistor Q3 with a pnp bipolar transistor. Although the foregoing embodiment is an application of the present invention to a static RAM based on bipolar CMOS, the invention is equally applicable to a variety of LSI devices, such as gate arrays, based on bipolar CMOS.

The effectiveness achieved by the present invention is summarized as follows. The reliability of semiconductor integrated circuit devices is improved. The current limiting resistor of the input protective element is prevented from breakage due to heat, whereby the electrostatic durability of semiconductor integrated circuit devices is enhanced.

What is claimed is:

1. A semiconductor integrated circuit device incorporating a bipolar transistor and MISFET comprising:
    a semiconductor substrate of a first conductivity type having at least an input protective portion and an input buffer circuit portion, said portions being respectively formed near a main surface of said semiconductor substrate;
    a first semiconductor region of the first conductivity type formed in said input protective portion of said substrate, said first semiconductor region having a lowermost face and end sides;
    a second semiconductor region of a second, conductivity type, opposite said first conductivity type, formed in said input protective portion of said substrate so that said first semiconductor region is surrounded at its lowermost face and end sides by said second semiconductor region and is electrically isolated from said semiconductor substrate;
    a third semiconductor region of the second conductivity type formed in said first semiconductor region;
    a MISFET formed in said input buffer portion of said substrate; and
    a first voltage supplying line for supplying a first operating voltage and a second voltage supplying line for supplying a second operating voltage, wherein said second semiconductor region is connected to said first operating voltage supplying line and said semiconductor substrate is connected to said second operating voltage supplying line, the polarity of said first operating voltage with respect to said second operating voltage being such as to effect a reverse bias condition between said second semiconductor region and said semiconductor substrate, said third semiconductor region has one end connected to an input terminal and another end connected to a gate electrode of said MISFET formed in said semiconductor substrate of said input buffer circuit portion, and wherein said first region is to be in an electrically floating state during operation of said device.

2. A semiconductor integrated circuit device according to claim 1, wherein said third semiconductor region is used as a resistor element.

3. A semiconductor integrated circuit device according to claim 2, wherein said resistor element is a current limiting resistor.

4. A semiconductor integrated circuit device according to claim 1, wherein said first conductivity type is a p-type and said second conductivity type is an n-type.

5. A semiconductor integrated circuit device according to claim 1, further comprising a voltage clamping MISFET formed in said input protective portion of said substrate, wherein a drain region of said voltage clamping MISFET is connected to said another end of said third semiconductor region, and wherein a source region and a gate electrode of said voltage clamping MISFET are connected to said second operating voltage line and to each other.

6. A semiconductor integrated circuit device according to claim 5, wherein said third semiconductor region is used as a resistor element.

7. A semiconductor integrated circuit device according to claim 6, wherein said resistor element is a current limiting resistor.

8. A semiconductor integrated circuit device according to claim 5, wherein said first conductivity type is a p-type and said second conductivity type is an n-type.

9. A semiconductor integrated circuit device according to claim 6, wherein said resistor element and said voltage clamping MISFET are protective elements for protecting said MISFET formed in said input buffer portion from a voltage applied to said input terminal of a magnitude exceeding an acceptable range.

10. A semiconductor integrated circuit device according to claim 1, wherein said third semiconductor region is a diffused region which forms a diffused resistor.

11. A semiconductor integrated circuit device according to claim 5, wherein said third semiconductor region is a diffused region which forms a diffused resistor.

* * * * *